(12) United States Patent
Nakanishi

(10) Patent No.: US 11,431,147 B2
(45) Date of Patent: Aug. 30, 2022

(54) OPTICAL MODULE

(71) Applicant: SUMITOMO ELECTRIC INDUSTRIES, LTD., Osaka (JP)

(72) Inventor: Hiromi Nakanishi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 395 days.

(21) Appl. No.: 16/648,631

(22) PCT Filed: Sep. 27, 2018

(86) PCT No.: PCT/JP2018/035866
§ 371 (c)(1),
(2) Date: Mar. 18, 2020

(87) PCT Pub. No.: WO2019/069775
PCT Pub. Date: Apr. 11, 2019

(65) Prior Publication Data
US 2020/0287348 A1   Sep. 10, 2020

(30) Foreign Application Priority Data

Oct. 5, 2017   (JP) .............................. JP2017-195304

(51) Int. Cl.
| | |
|---|---|
| *G02B 26/10* | (2006.01) |
| *H01S 5/02253* | (2021.01) |
| *G03B 21/00* | (2006.01) |
| *H01S 5/02325* | (2021.01) |
| *H01S 5/024* | (2006.01) |
| *H01S 5/40* | (2006.01) |

(52) U.S. Cl.
CPC ........ *H01S 5/02325* (2021.01); *G02B 26/105* (2013.01); *G03B 21/008* (2013.01); *H01S 5/02253* (2021.01); *H01S 5/02407* (2013.01); *H01S 5/40* (2013.01)

(58) Field of Classification Search
CPC . G03B 21/008; G02B 26/105; H01S 5/02253; H01S 5/02407; H01S 5/40; H01S 5/02325
USPC ......................................................... 353/30
See application file for complete search history.

(56) References Cited

U.S. PATENT DOCUMENTS

| | | |
|---|---|---|
| 2007/0273794 A1 | 11/2007 | Sprague et al. |
| 2010/0141896 A1 | 6/2010 | Chen et al. |

(Continued)

FOREIGN PATENT DOCUMENTS

| | | |
|---|---|---|
| JP | 2009-533715 A | 9/2009 |
| JP | 2013-190594 A | 9/2013 |

(Continued)

*Primary Examiner* — Jerry L Brooks
(74) *Attorney, Agent, or Firm* — Oliff PLC

(57) ABSTRACT

An optical module includes: a light emitting unit configured to generate light; a mirror mechanism configured to reflect the light generated by the light emitting unit; and a scanning unit configured to scan the light reflected from the mirror mechanism. The light emitting unit includes: a light forming unit including a plurality of semiconductor light emitting elements and a filter that multiplexes light beams from the plurality of semiconductor light emitting elements; and a protective member disposed so as to surround the light forming unit. The mirror mechanism is disposed outside the protective member and integrated with the protective member, and the scanning unit is disposed in a region surrounded by the protective member.

10 Claims, 12 Drawing Sheets

(56) References Cited

U.S. PATENT DOCUMENTS

| | | |
|---|---|---|
| 2013/0242265 A1 | 9/2013 | Kato et al. |
| 2014/0078473 A1 | 3/2014 | Kusaka et al. |
| 2017/0207606 A1 | 7/2017 | Nakanishi |

FOREIGN PATENT DOCUMENTS

| | | |
|---|---|---|
| JP | 2014-056199 A | 3/2014 |
| JP | 2014-186068 A | 10/2014 |
| JP | 2016-015415 A | 1/2016 |
| WO | 2007/120831 A2 | 10/2007 |

OPTICAL MODULE

TECHNICAL FIELD

The present disclosure relates to an optical module. The present application claims priority from Japanese Patent Application No. 2017-195304 filed on Oct. 5, 2017, the entire contents of which are incorporated herein by reference.

There are known optical modules each including: a light emitting unit in which light beams from a plurality of semiconductor light emitting elements are multiplexed; and a scanning unit that scans the light from the light emitting unit (see, for example, PTL 1 to PTL 3). With these optical modules, the light from the light emitting unit can be scanned along a desired path to draw letters, figures, etc.

CITATION LIST

Patent Literature

PTL 1: Japanese Unexamined Patent Application Publication No. 2014-186068
PTL 2: Japanese Unexamined Patent Application Publication No. 2014-56199
PTL 3: International Publication No. WO2007/120831

SUMMARY OF INVENTION

The optical module of the present disclosure includes: a light emitting unit configured to generate light; a mirror mechanism configured to reflect the light generated by the light emitting unit; and a scanning unit configured to scan the light reflected from the mirror mechanism. The light emitting unit includes: a light forming unit including a plurality of semiconductor light emitting elements and a filter that multiplexes light beams from the plurality of semiconductor light emitting elements; and a protective member disposed so as to surround the light forming unit. The mirror mechanism is disposed outside the protective member and integrated with the protective member, and the scanning unit is disposed in a region surrounded by the protective member.

DESCRIPTION OF EMBODIMENTS

Figure 1:
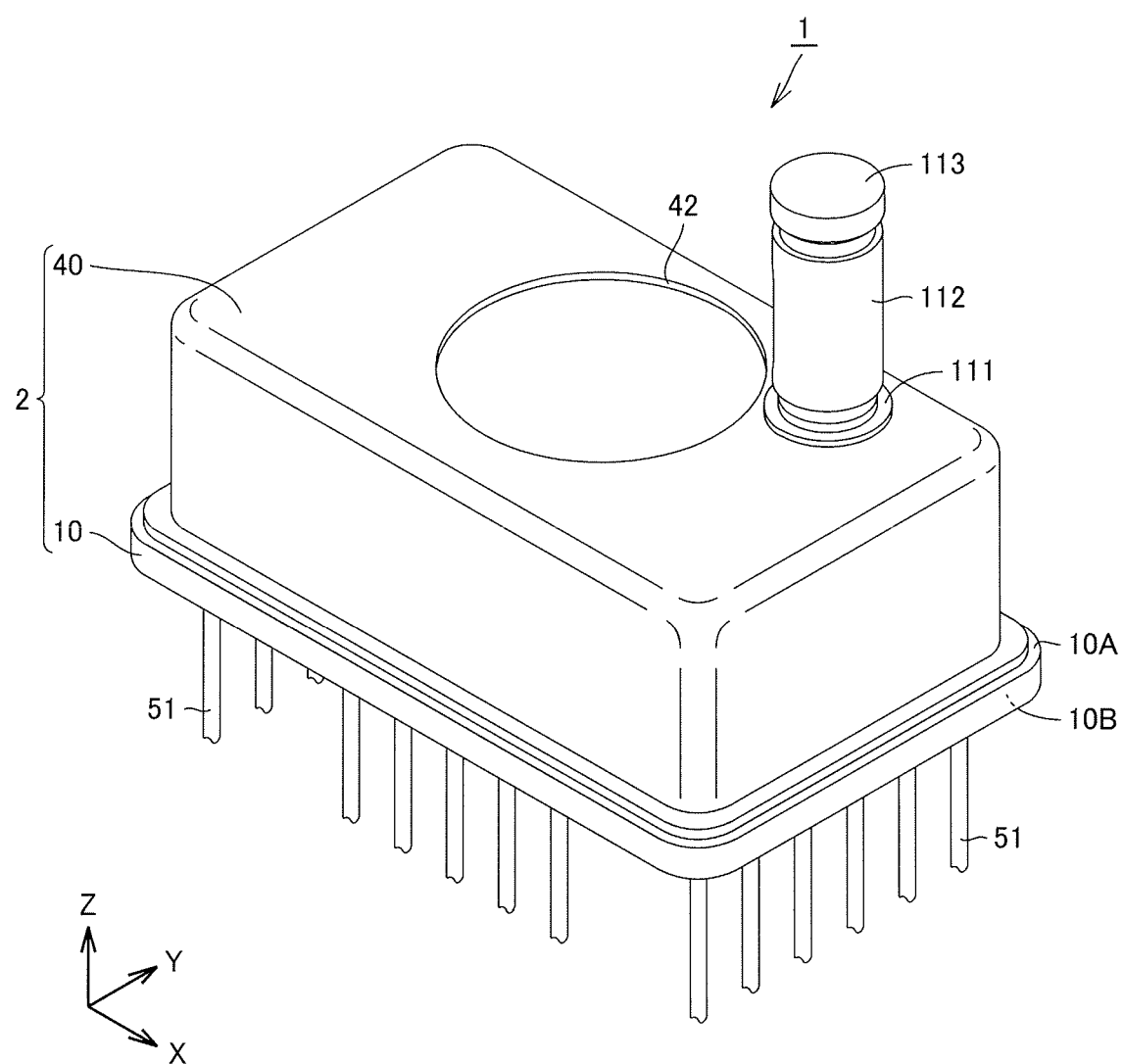
FIG. 1 is a first schematic perspective view showing the structure of an optical module in embodiment 1.

In conventional optical modules, it is preferable from the viewpoint of improving durability that the optical component for multiplexing the light beams from the semiconductor light emitting elements, the scanning unit, etc. are disposed inside the protective member. However, when such a structure is employed, a problem arises in that the optical module is increased in size in order to appropriately form optical paths within the protective member (e.g., in order to reduce the incident and reflection angles of the light to some extent when the light is reflected within the protective member).

DESCRIPTION OF EMBODIMENTS OF PRESENT DISCLOSURE

First, embodiments of the present disclosure will be enumerated and described. The optical module of the present disclosure includes: a light emitting unit configured to generate light; a mirror mechanism configured to reflect the light generated by the light emitting unit; and a scanning unit configured to scan the light reflected from the mirror mechanism. The light emitting unit includes: a light forming unit including a plurality of semiconductor light emitting elements and a filter that multiplexes light beams from the plurality of semiconductor light emitting elements; and a protective member disposed so as to surround the light forming unit. The mirror mechanism is disposed outside the protective member and integrated with the protective member, and the scanning unit is disposed in a region surrounded by the protective member.

In the light emitting unit of the optical module of the present disclosure, the light beams from the plurality of semiconductor light emitting elements are multiplexed by the filter. Therefore, the light beams from the plurality of semiconductor light emitting elements are multiplexed and allowed to reach the scanning unit. The scanning unit is disposed inside the protective member and scans the light from the light emitting unit along a desired path to draw letters, figures, etc. By protecting not only the semiconductor light emitting elements and the filter but also the scanning unit by the protective member as described above, the durability of the optical module can be improved. In the optical module of the present disclosure, the mirror mechanism that reflects the light from the light emitting unit to cause the light to reach the scanning unit is disposed outside the protective member and integrated with the protective member. By disposing the mirror mechanism in the manner described above, components for providing the light path from the light emitting unit to the scanning unit can be easily arranged close to each other, and an increase in size of the optical module can be prevented. Therefore, the optical module provided in the present disclosure can have improved durability while an increase in size is prevented. The filter used may be a wavelength selective filter, a polarization beam combining filter, etc.

In the above optical module, the light forming unit may include a member (hereinafter may be referred to as a light shield member) having a plurality of through holes provided so as to correspond to the respective semiconductor light emitting elements, and each of the plurality of through holes may be configured to allow only the light beam from a corresponding one of the plurality of semiconductor light emitting elements to pass through. In this case, stray light from the side on which the semiconductor light emitting elements are disposed can be blocked. In particular, when the scanning unit is disposed inside the protective member, stray light from the side on which the semiconductor light emitting elements are disposed can be effectively prevented from reaching the scanning unit.

The optical module may further include a scanning unit holding member that holds the scanning unit at a level different from the level of a mounting surface of the light forming unit with respect to a direction perpendicular to the mounting surface, the mounting surface being a surface on which the plurality of semiconductor light emitting elements are mounted. In this case, stray light from the region in which the semiconductor light emitting elements are disposed can be effectively prevented from reaching the scanning unit.

In the above optical module, the mirror mechanism may include: a mirror that reflects the light generated by the light emitting unit; and a mirror holder that is placed on the protective member and holds the mirror. By holding the mirror by the mirror holder placed on the protective member, an increase in the size of the optical module caused by the placement of the mirror mechanism can be prevented.

In the above optical module, the protective member may have: a first window from which the light directed from the light emitting unit toward the mirror mechanism is emitted; and a second window through which the light reflected from the mirror mechanism and directed toward the scanning unit enters. In this case, the light from the light emitting unit is allowed to reach the scanning unit easily while an increase in the size of the optical module is prevented.

In the above optical module, the light from the scanning unit may be emitted to the outside of the protective member through the second window. By using, as a path through which the light from the scanning unit is emitted, the second window through which the light directed from the mirror mechanism toward the scanning unit enters as described above, the number of components can be reduced.

In the above optical module, the protective member may be an airtight member whose interior is made airtight. Specifically, the interior of the protective member may be hermetically sealed by the protective member. In this case, deterioration of the components disposed inside the protective member can be prevented effectively.

In the above optical module, the plurality of semiconductor light emitting elements may include a first semiconductor light emitting element that emits red light, a second semiconductor light emitting element that emits green light, and a third semiconductor light emitting element that emits blue light. In this case, the red light, the green light, and the blue light can be multiplexed to form light of a desired color.

In the above optical module, each of the plurality of semiconductor light emitting elements may be a laser diode. In this case, emission light with small variations in wavelength can be obtained.

DETAILS OF EMBODIMENTS OF PRESENT DISCLOSURE

Next, embodiments of the optical module according to the present disclosure will be described with reference to the drawings. In the following drawings, the same or corresponding components are denoted by the same reference numerals, and the description thereof may not be repeated.

Embodiment 1

Figure 2:
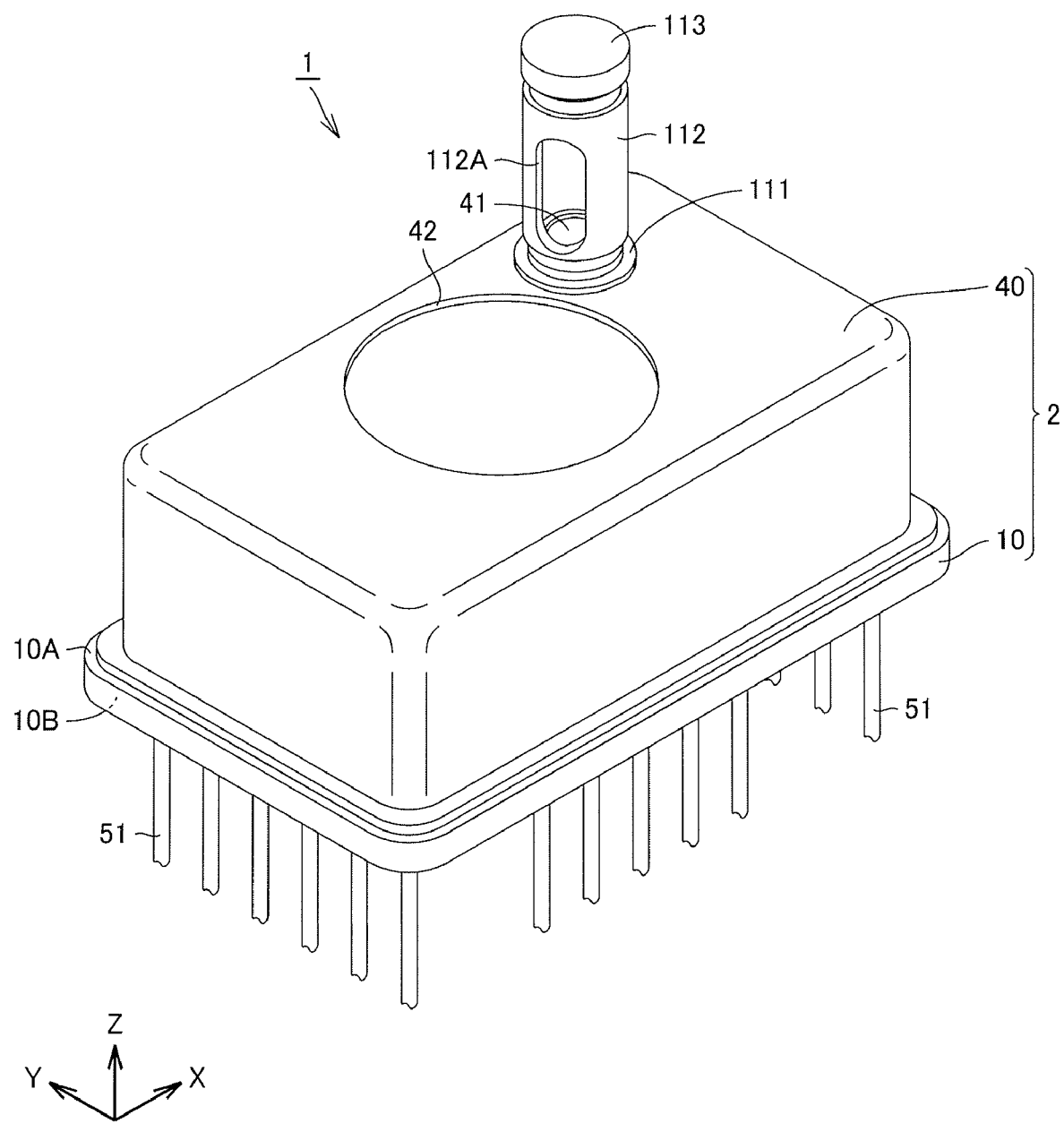
FIG. 2 is a second schematic perspective view showing the structure of the optical module in embodiment 1.
Figure 3:
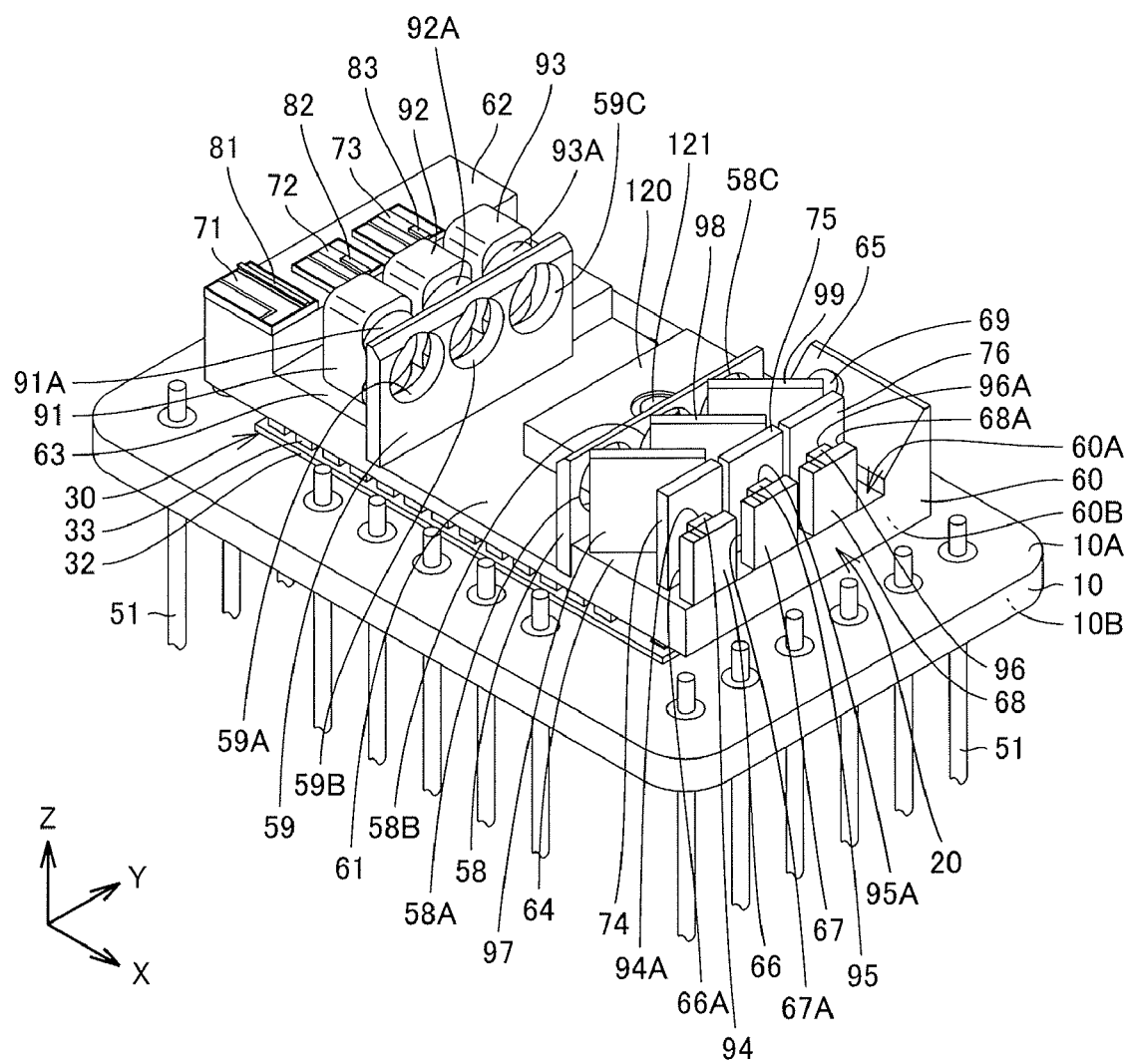
FIG. 3 is a schematic perspective view with a cap in FIG. 1 removed.
Figure 4:
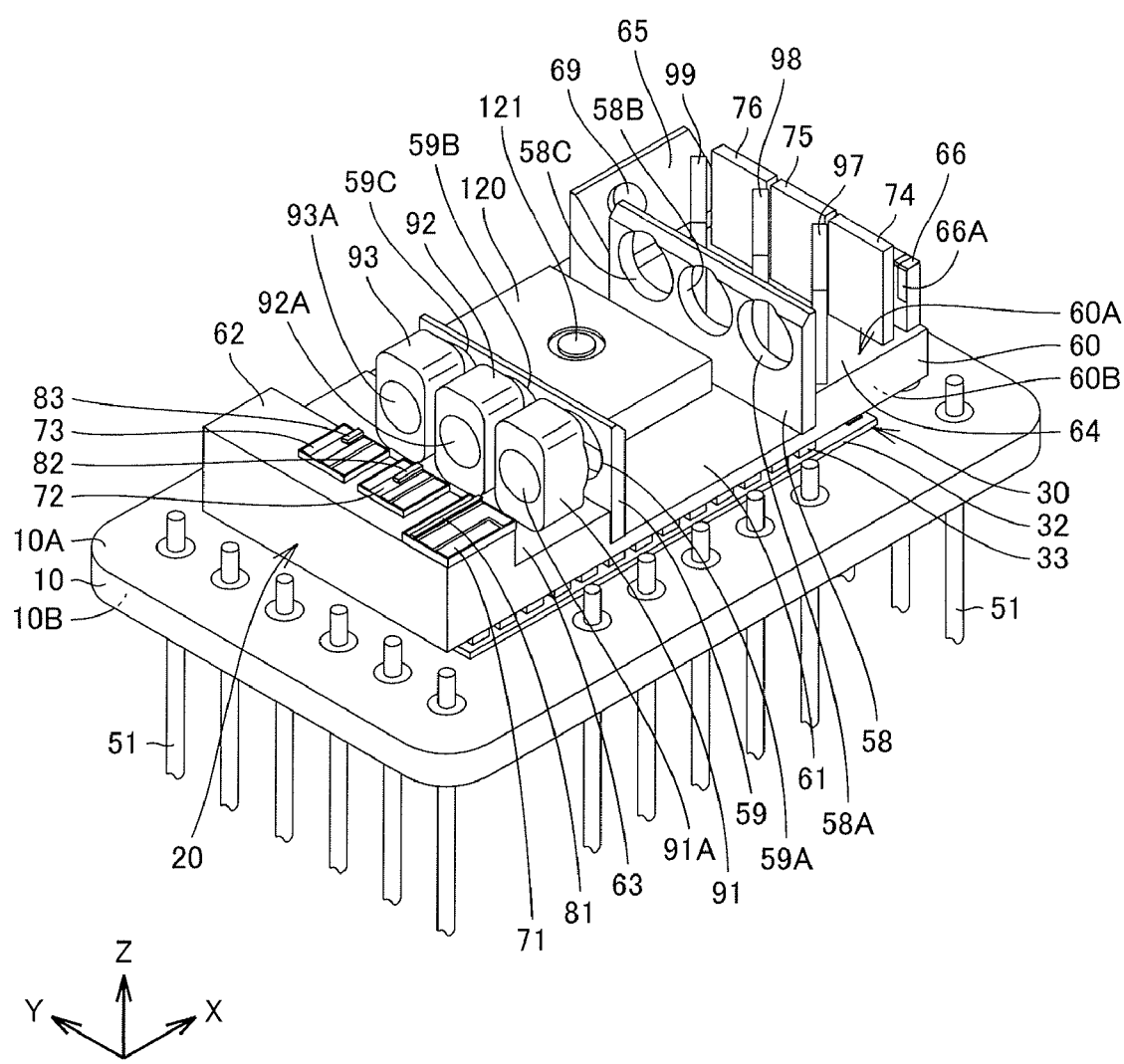
FIG. 4 is a schematic perspective view with the cap in FIG. 2 removed.
Figure 5:
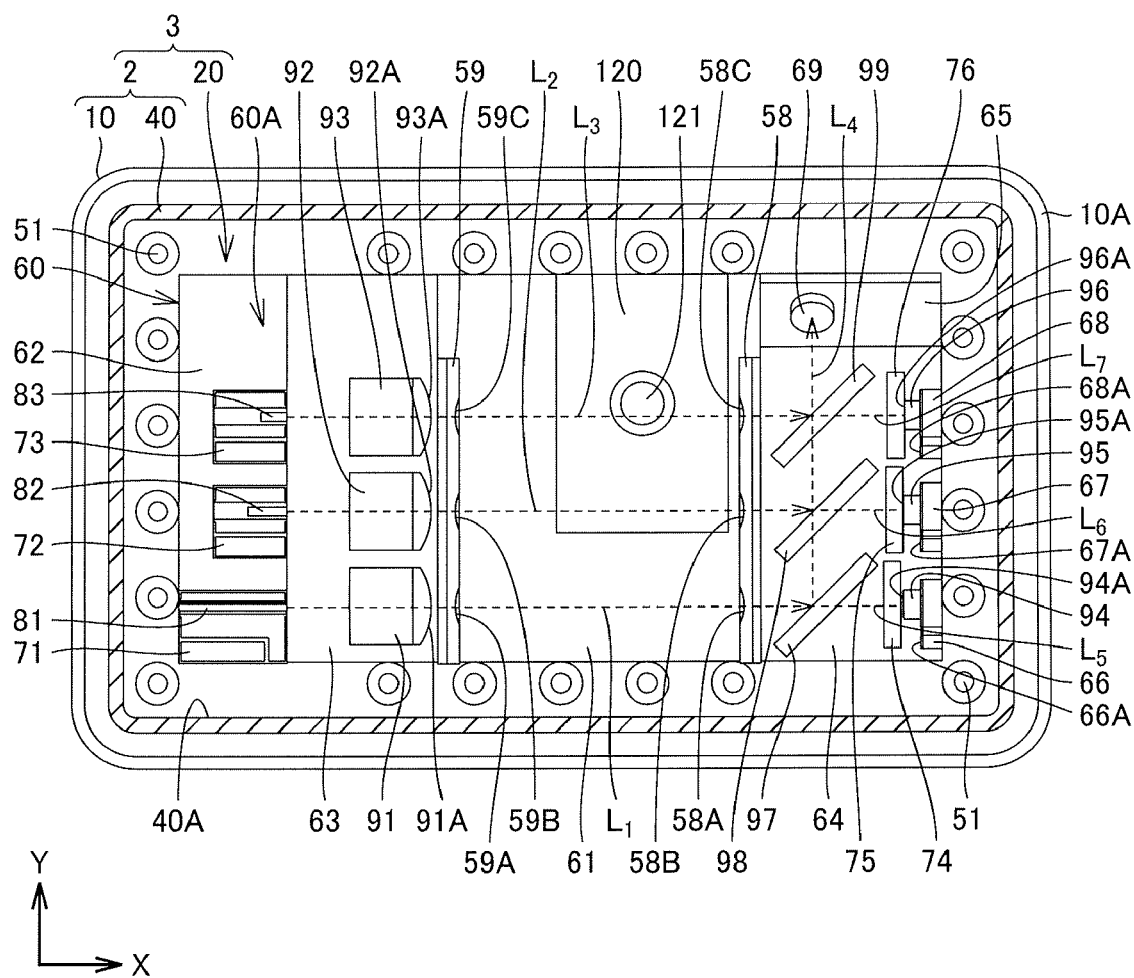
FIG. 5 is a first schematic illustration showing the structure of the optical module in embodiment 1.
Figure 6:
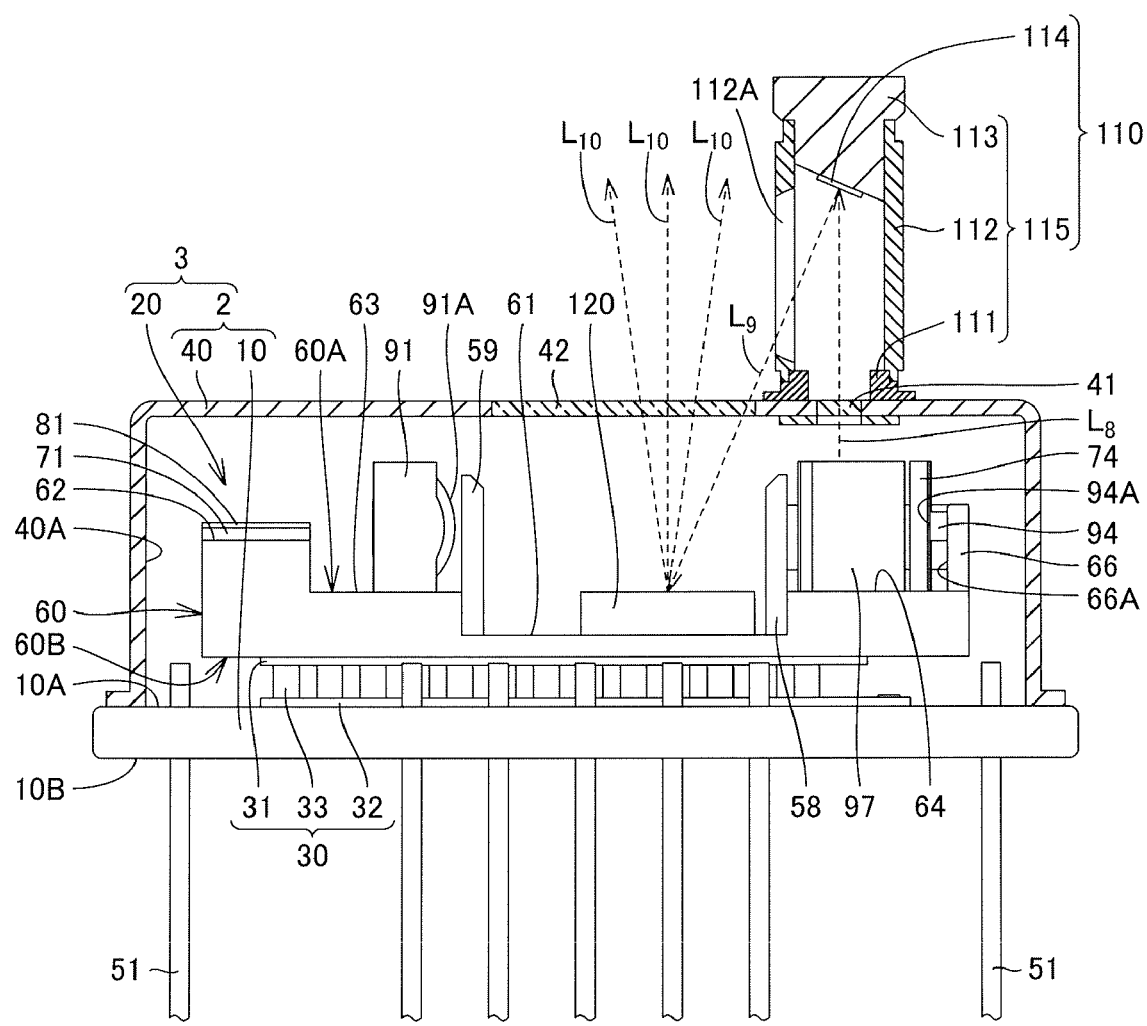
FIG. 6 is a second schematic illustration showing the structure of the optical module in embodiment 1.

Referring first to FIGS. 1 to 6, embodiment 1 will be described. FIG. 1 is a first schematic perspective view showing the structure of an optical module in embodiment 1. FIG. 2 is a second schematic perspective view showing the structure of the optical module when it is viewed from a different viewpoint from that in FIG. 1. FIG. 3 is a perspective view corresponding to a state with a cap 40 in FIG. 1 removed. FIG. 4 is a perspective view corresponding to the state with the cap 40 in FIG. 2 removed. FIG. 5 is a first schematic illustration in the X-Y plane showing a cross section of the cap 40 and a plan view of other components. FIG. 6 is a second schematic illustration in the X-Z plane showing cross sections of the cap 40 and a mirror holder 115 and a plan view of other components.

Referring to FIGS. 1 to 4, the optical module 1 in the present embodiment includes: a base 10 having a flat plate shape; a light forming unit 20 that is disposed on a first principal surface 10A of the base 10 and forms light; the cap 40 disposed in contact with the first principal surface 10A of the base 10 so as to cover the light forming unit 20; and a plurality of lead pins 51 passing through the base 10 so as to extend from a second principal surface 10B of the base 10 to the first principal surface 10A and protruding from both the first principal surface 10A and the second principal surface 10B. The base 10 and the cap 40 are, for example, welded together to obtain an airtight state. Specifically, the light forming unit 20 is hermetically sealed by the base 10 and the cap 40. A gas such as dry air with reduced water content (or with water removed therefrom) is sealed in the space surrounded by the base 10 and the cap 40. A first window 41 and a second window 42 are formed in the cap 40. Each of the first window 41 and the second window 42 is fitted with, for example, a flat plate-shaped glass member (not shown). The base 10 and the cap 40 form a protective member 2. In the present embodiment, the protective member 2 is an airtight member whose interior is made airtight. The protective member 2 and the light forming unit 20 form a light emitting unit 3.

Referring to FIGS. 3 to 6, the light forming unit 20 includes a base plate 60 that is a base member having a plate shape. The base plate 60 has a first principal surface 60A having a rectangular shape in a plan view. The first principal surface 60A of the base plate 60 includes a base region 61, a chip mounting region 62, a lens mounting region 63, and a filter mounting region 64. The chip mounting region 62 is formed in a region including a first short side of the first principal surface 60A so as to extend along the first short side. The lens mounting region 63 is formed adjacent to the chip mounting region 62 so as to extend along the chip mounting region 62. The filter mounting region 64 is formed in a region including a second short side of the first principal surface 60A so as to extend along the second short side. A region between the lens mounting region 63 and the filter mounting region 64 is the base region 61. The base region 61, the chip mounting region 62, the lens mounting region 63, and the filter mounting region 64 are parallel to each other.

The thickness of the base plate 60 in the lens mounting region 63 and in the filter mounting region 64 is larger than the thickness of the base plate 60 in the base region 61. Therefore, the levels of the lens mounting region 63 and the filter mounting region 64 (their levels with respect to the base region 61, i.e., the levels in a direction perpendicular to the base region 61) are higher than the level of the base region 61. Moreover, the thickness of the base plate 60 in the chip mounting region 62 is larger than the thickness of the base plate 60 in the lens mounting region 63 and in the filter mounting region 64. Therefore, the level of the chip mounting region 62 is higher than the levels of the lens mounting region 63 and the filter mounting region 64.

A first submount 71, a second submount 72, and a third submount 73 each having a flat plate shape are disposed in the chip mounting region 62 so as to be arranged along the first short side of the first principal surface 60A. The second submount 72 is disposed so as to be sandwiched between the first submount 71 and the third submount 73. A red laser diode 81 serving as a first semiconductor light emitting element is disposed on the first submount 71. A green laser diode 82 serving as a second semiconductor light emitting element is disposed on the second submount 72. A blue laser diode 83 serving as a third semiconductor light emitting element is disposed on the third submount 73. The levels of the optical axes of the red laser diode 81, the green laser diode 82, and the blue laser diode 83 (the distances between the optical axes and a reference plane that is the base region 61 of the first principal surface 60A; the distances in the Z-axis direction from the reference plane) are adjusted by the first submount 71, the second submount 72, and the third submount 73, respectively, so as to coincide with each other.

A first lens 91, a second lens 92, and a third lens 93 are disposed in the lens mounting region 63. The first lens 91, the second lens 92, and the third lens 93 have lens portions 91A, 92A and 93A, respectively, having lens surfaces. In the first lens 91, the second lens 92, and the third lens 93, the lens portions 91A, 92A and 93A and respective regions other than the lens portions 91A, 92A and 93A are integrally formed. The center axes of the lens portions 91A, 92A and 93A of the first lens 91, the second lens 92, and the third lens 93, i.e., the optical axes of the lens portions 91A, 92A and 93A, coincide with the optical axes of the red laser diode 81, the green laser diode 82, and the blue laser diode 83, respectively. The first lens 91, the second lens 92, and the third lens 93 change the spot sizes of light beams emitted from the red laser diode 81, the green laser diode 82, and the blue laser diode 83, respectively. The first lens 91, the second lens 92, and the third lens 93 change the spot sizes such that the spot sizes of the light beams emitted from the red laser diode 81, the green laser diode 82, and the blue laser diode 83 coincide with each other. The first lens 91, the second lens 92, and the third lens 93 convert the light beams emitted from the red laser diode 81, the green laser diode 82, and the blue laser diode 83, respectively, into collimated light beams.

A first filter 97, a second filter 98, and a third filter 99 are disposed in the filter mounting region 64. The first filter 97 is disposed on a straight line connecting the red laser diode 81 to the first lens 91. The second filter 98 is disposed on a straight line connecting the green laser diode 82 to the second lens 92. The third filter 99 is disposed on a straight line connecting the blue laser diode 83 to the third lens 93. Each of the first filter 97, the second filter 98, and the third filter 99 has a flat plate shape having principal surfaces parallel to each other. The first filter 97, the second filter 98, and the third filter 99 are, for example, wavelength selective filters. The first filter 97, the second filter 98, and the third filter 99 are dielectric multilayer filters.

More specifically, the first filter 97 reflects red light. The second filter 98 transmits red light and reflects green light. The third filter 99 transmits red light and green light and reflects blue light. As described above, the first filter 97, the second filter 98, and the third filter 99 selectively transmit and reflect light beams having specific wavelengths. Therefore, the first filter 97, the second filter 98, and the third filter 99 multiplex the light beams emitted from the red laser diode 81, the green laser diode 82, and the blue laser diode 83.

A first support plate 66, a second support plate 67, and a third support plate 68 each having a flat plate shape are disposed in the filter mounting region 64 so as to be arranged along the second short side of the first principal surface 60A. A first photodiode 94 serving as a first light receiving element, a second photodiode 95 serving as the second light receiving element, and a third photodiode 96 serving as a third light receiving element are disposed on surfaces 66A, 67A, and 68A of the first support plate 66, the second support plate 67, and the third support plate 68, respectively. The first photodiode 94, the second photodiode 95, and the third photodiode 96 are disposed on lines extending in the light emitting direction from the red laser diode 81, the green laser diode 82, and the blue laser diode 83, respectively. In the present embodiment, the light receiving elements are disposed so as to correspond to their respective semiconductor light emitting elements. The first photodiode 94, the second photodiode 95, and the third photodiode 96 are photodiodes capable of receiving red light, green light, and blue light, respectively.

A fourth filter 74, a fifth filter 75, and a sixth filter 76 are disposed in the filter mounting region 64 at their respective positions between the region in which the first filter 97, the second filter 98, and the third filter 99 are disposed and the region in which the first photodiode 94, the second photodiode 95, and the third photodiode 96 are disposed. The fourth filter 74 is disposed between the first filter 97 and the first photodiode 94. The fifth filter 75 is disposed between the second filter 98 and the second photodiode 95. The sixth filter 76 is disposed between the third filter 99 and the third photodiode 96. The fourth filter 74 transmits red light emitted from the red laser diode 81 and having a certain wavelength and reflects light having different wavelengths. The fifth filter 75 transmits green light emitted from the green laser diode 82 and having a certain wavelength and reflects light having different wavelengths. The sixth filter 76 transmits blue light emitted from the blue laser diode 83 and having a certain wavelength and reflects light having different wavelengths.

A first mirror mounting region 65 parallel to the long side direction of the first principal surface 60A and inclined relative to the filter mounting region 64 is formed at an edge opposite, with respect to a direction along the second short side of the first principal surface 60A, to the side of the filter mounting region 64 on which the first filter 97 is mounted. The first mirror mounting region 65 is inclined, for example, 45° relative to the filter mounting region 64. A first mirror 69 is mounted on the first mirror mounting region 65.

The first mirror 69 is disposed so as to overlap the first window 41 in plan view perpendicular to the base region 61.

A first light shield member 59, which is a flat plate-shaped wall member, is disposed in the base region 61 so as to extend along its boundary with the lens mounting region 63. A first through hole 59A, a second through hole 59B, and a third through hole 59C corresponding to the red laser diode 81, the green laser diode 82, and the blue laser diode 83, respectively, are formed in the first light shield member 59 so as to pass through the first light shield member 59 in its thickness direction. The light from the red laser diode 81 passes through the first through hole 59A. The light from the green laser diode 82 passes through the second through hole 59B. The light from the blue laser diode 83 passes through the third through hole 59C.

A second light shield member 58, which is a flat plate-shaped wall member, is disposed in the base region 61 so as to extend along its boundary with the filter mounting region 64. A fourth through hole 58A, a fifth though hole 58B, and a sixth through hole 58C corresponding to the red laser diode 81, the green laser diode 82, and the blue laser diode 83, respectively, are formed in the second light shield member 58 so as to pass through the second light shield member 58 in its thickness direction. The light from the red laser diode 81 passes through the fourth through hole 58A. The light from the green laser diode 82 passes through the fifth through hole 58B. The light from the blue laser diode 83 passes through the sixth through hole 58C.

A scanning unit 120 (optical scanner) that scans light from the light emitting unit 3 is further disposed in the base region 61. The scanning unit 120 includes a scanning mirror 121 that is driven by a drive mechanism (not shown) disposed inside the scanning unit 120. The drive mechanism used may be, for example, an MEMS (Micro Electro Mechanical Systems).

The scanning unit 120 is disposed integrally with the light emitting unit 3. The scanning unit 120 is disposed inside the region surrounded by the base 10 and the cap 40 that serve as the protective member 2.

Referring to FIG. 5, the red laser diode 81, the lens portion 91A of the first lens 91, the first through hole 59A of the first light shield member 59, the fourth through hole 58A of the second light shield member 58, the first filter 97, the fourth filter 74, and a light receiving portion 94A of the first photodiode 94 are arranged in a straight line extending in the light emission direction of the red laser diode 81 (aligned in the X axis direction). The green laser diode 82, the lens portion 92A of the second lens 92, the second through hole 59B of the first light shield member 59, the fifth through hole 58B of the second light shield member 58, the second filter 98, the fifth filter 75, and a light receiving portion 95A of the second photodiode 95 are arranged in a straight line extending in the light emission direction of the green laser diode 82 (aligned in the X axis direction). The blue laser diode 83, the lens portion 93A of the third lens 93, the third through hole 59C of the first light shield member 59, the sixth through hole 58C of the second light shield member 58, the third filter 99, the sixth filter 76, and a light receiving portion 96A of the third photodiode 96 are arranged in a straight line extending in the light emission direction of the blue laser diode 83 (aligned in the X axis direction).

The emission direction of the red laser diode 81, the emission direction of the green laser diode 82, and the emission direction of the blue laser diode 83 are parallel to each other. The principal surfaces of the first filter 97, the second filter 98, and the third filter 99 are tilted 45° relative to the emission directions of the red laser diode 81, the green laser diode 82 and the blue laser diode 83, respectively (relative to the X axis direction).

An electronic cooling module 30 is disposed between the base 10 and the light forming unit 20. The electronic cooling module 30 includes a heat absorption plate 31, a heat dissipation plate 32, and semiconductor pillars 33 arranged between the heat absorption plate 31 and the heat dissipation plate 32 with electrodes interposed therebetween. The heat absorption plate 31 and the heat dissipation plate 32 are formed of, for example, alumina. The heat absorption plate 31 is disposed in contact with a second principal surface 60B of the base plate 60. The heat dissipation plate 32 is disposed in contact with the first principal surface 10A of the base 10. In the present embodiment, the electronic cooling module 30 is a Peltier module (Peltier element). When a current flows through the electronic cooling module 30, heat in the base plate 60 in contact with the heat absorption plate 31 transfers to the base 10, and the base plate 60 is thereby cooled. This can prevent an increase in temperature of the red laser diode 81, the green laser diode 82, and the blue laser diode 83. Therefore, the optical module 1 can be used in a high-temperature environment, e.g., in the case where the optical module 1 is mounted on an automobile. Moreover, by maintaining the temperatures of the red laser diode 81, the green laser diode 82, and the blue laser diode 83 appropriately, light of a desired color can by formed accurately.

Referring to FIGS. 1, 2, and 6, a first support member 111 having an annular shape (circular annular shape) with a through hole formed in a radially central portion is disposed on the cap 40. The first support member 111 is disposed such that the through hole overlaps the first window 41 in plan view. A second support member 112 having a hollow cylindrical shape (hollow circular cylindrical shape) is disposed on the first support member 111. A through hole 112A is formed in the side wall of the second support member 112 so as to pass therethrough in its thickness direction. The second support member 112 is connected to the first support member 111 on a first axial end side of the second support member 112. The first support member 111 and the second support member 112 are disposed such that their center axes coincide with each other. A second axial end side of the second support member 112 is sealed with a third support member 113. The third support member 113 is disposed such that part of the third support member 113 is inserted into a space surrounded by the second support member 112. A support surface is formed in a portion of the third support member 113 that is inserted into the space surrounded by the second support member 112. A second mirror 114 is placed on the support surface. The first support member 111, the second support member 112, and the third support member 113 form the mirror holder 115 that is placed on the cap 40 included in the protective member 2 and holds the second mirror 114.

The second mirror 114 reflects the light from the light emitting unit 3 (from the first mirror 69) such that the light reaches the scanning mirror 121 of the scanning unit 120. The alignment of the second mirror 114 can be made as follows. The alignment in directions along the principal surface 60A (in X-Y directions) is made using the first support member 111, and the alignment in a direction perpendicular to the principal surface 60A (in the Z direction) is made using the second support member 112. The alignment in a rotation direction in a plane along the principal surface 60A (a rotation direction in the X-Y plane) is made using the third support member 113. Specifically, for example, the first support member 111, the second support member 112, and the third support member 113 are temporarily fixed using an ultraviolet curable resin (UV resin). After completion of the alignment, the UV resin is irradiated with ultraviolet rays to cure the resin, and these members can thereby be finally fixed. The final fixation may be performed by welding using a YAG (Yttrium Aluminum Garnet) laser. By performing the alignment in advance as described above, the optical module 1 can be easily installed. The first support member 111, the second support member 112, the third support member 113, and the second mirror 114 form a mirror mechanism 110. The mirror mechanism 110 is disposed integrally with the cap 40 included in the protective member 2 and reflects the light generated by the light emitting unit 3 to allow the light to reach the scanning unit 120. The mirror mechanism 110 is disposed outside the protective member 2. The mirror mechanism 110 is placed on the outer surface of the cap 40 included in the protective member 2.

Next, the operation of the optical module 1 in the present embodiment will be described. Referring to FIG. 5, the red light emitted from the red laser diode 81 travels along an optical path $L_1$. This red light is incident on the lens portion 91A of the first lens 91, and the spot size of the light is changed. Specifically, for example, the red light emitted from the red laser diode 81 is converted into collimated light. The red light whose spot size has been changed in the first lens 91 travels along the optical path $L_1$, passes through the first through hole 59A of the first light shield member 59 and the fourth through hole 58A of the second light shield member 58, and is then incident on the first filter 97.

Since the first filter 97 reflects the red light, the light emitted from the red laser diode 81 travels further along an optical path $L_4$ and is incident on the second filter 98. Since the second filter 98 transmits the red light, the light emitted from the red laser diode 81 travels further along the optical path $L_4$ and is incident on the third filter 99. Since the third filter 99 transmits the red light, the light emitted from the red laser diode 81 travels further along the optical path $L_4$ and reaches the first mirror 69. Referring to FIGS. 5 and 6, the red light reaching the first mirror 69 is reflected from the first mirror 69, passes through the first window 41, and is emitted to the outside of the cap 40 along an optical path $L_8$.

Referring to FIG. 5, part of the red light incident on the first filter 97 passes through the first filter 97, travels along an optical path $L_5$, and is incident on the fourth filter 74. Since the fourth filter 74 transmits the red light, the red light travels further along the optical path $L_5$ and is incident on the light receiving portion 94A of the first photodiode 94. The intensity of the red light emitted from the red laser diode 81 is thereby determined, and the intensity of the red light is adjusted based on the difference between the determined light intensity and the target intensity of the light to be emitted.

The green light emitted from the green laser diode 82 travels along an optical path $L_2$. This green light is incident on the lens portion 92A of the second lens 92, and the spot size of the light is changed. Specifically, for example, the green light emitted from the green laser diode 82 is converted into collimated light. The green light whose spot size has been changed in the second lens 92 travels along the optical path $L_2$, passes through the second through hole 59B of the first light shield member 59 and the fifth through hole 58B of the second light shield member 58, and is then incident on the second filter 98.

Since the second filter 98 reflects the green light, the light emitted from the green laser diode 82 joins into the optical path $L_4$. Therefore, the green light is multiplexed with the red light, travels along the optical path $L_4$, and is incident on the third filter 99. Since the third filter 99 transmits the green light, the light emitted from the green laser diode 82 travels further along the optical path $L_4$ and reaches the first mirror 69. Referring to FIGS. 5 and 6, the green light reaching the first mirror 69 is reflected from the first mirror 69, passes through the first window 41, and is emitted to the outside of the cap 40 along the optical path $L_8$.

Referring to FIG. 5, part of the green light incident on the second filter 98 passes through the second filter 98, travels along an optical path $L_6$, and is incident on the fifth filter 75. Since the fifth filter 75 transmits the green light, the green light travels further along the optical path $L_6$ and is incident on the light receiving portion 95A of the second photodiode 95. The intensity of the green light emitted from the green laser diode 82 is thereby determined, and the intensity of the green light is adjusted based on the difference between the determined light intensity and the target intensity of the light to be emitted.

The blue light emitted from the blue laser diode 83 travels along an optical path $L_3$. This blue light is incident on the lens portion 93A of the third lens 93, and the spot size of the light is changed. Specifically, for example, the blue light emitted from the blue laser diode 83 is converted into collimated light. The blue light whose spot size has been changed in the third lens 93 travels along the optical path $L_3$, passes through the third through hole 59C of the first light shield member 59 and the sixth through hole 58C of the second light shield member 58, and is then incident on the third filter 99.

Since the third filter 99 reflects the blue light, the light emitted from the blue laser diode 83 joins into the optical path $L_4$. Therefore, the blue light is multiplexed with the red light and the green light, travels along the optical path $L_4$, and reaches the first mirror 69. Referring to FIGS. 5 and 6, the blue light reaching the first mirror 69 is reflected from the first mirror 69, passes through the first window 41, and is emitted to the outside of the cap 40 along the optical path $L_8$.

Referring to FIG. 5, part of the blue light incident on the third filter 99 passes through the third filter 99, travels along an optical path $L_7$ and is incident on the sixth filter 76. Since the sixth filter 76 transmits the blue light, the blue light travels further along the optical path $L_7$ and is incident on the light receiving portion 96A of the third photodiode 96. The intensity of the blue light emitted from the blue laser diode 83 is thereby determined, and the intensity of the blue light is adjusted based on the difference between the determined light intensity and the target intensity of the light to be emitted.

As described above, the light (multiplexed light) formed by multiplexing the red light, the green light, and the blue light is emitted from the first window 41 of the cap 40 along the optical path $L_8$. The multiplexed light emitted from the first window 41 is reflected by the second mirror 114, travels along an optical path $L_9$, passes through the through hole 112A of the second support member 112 and the second window 42, and reaches the scanning mirror 121 of the scanning unit 120. The scanning mirror 121 is driven by a driving mechanism (not shown) to scan the multiplexed light, and characters, figures, etc. are drawn by the multiplexed light emitted through the second window 42 to the outside of the cap 40 along an optical path $L_{10}$.

In the optical module 1 in the present embodiment, the scanning unit 120 is disposed integrally with the light emitting unit 3 with their alignment made in advance (with the optical axis adjusted). Therefore, the optical module 1 can be installed more easily than an optical module in which, after the light emitting device and the scanning device are installed, the optical axes are adjusted.

Therefore, the optical module in the present embodiment can be easily installed and used to draw characters and figures.

Preferably, in the optical module 1, the outer diameter of the first mirror 69 is set to coincide with the beam diameter of multiplexed light scannable by the scanning mirror 121 of the scanning unit 120. Light that has reached the scanning unit 120 but is not scanned by the scanning mirror 121 may be reflected from a portion other than the scanning mirror 121, and this may cause stray light. However, in the above case, the occurrence of the stray light can be prevented.

In the optical module 1, the scanning unit 120 is disposed inside the protective member 2 (in the region surrounded by the cap 40 and the base 10). Therefore, the scanning unit 120 is effectively protected. In particular, in the optical module 1 in the present embodiment, the scanning unit 120 is hermetically sealed by the base 10 and the cap 40. Therefore, moisture, foreign matter, etc. are prevented from entering the scanning unit 120, and the durability of the optical module 1 is thereby improved.

The light forming unit of the optical module 1 in the present embodiment includes the first light shield member 59 and the second light shield member 58. This can effectively prevent stray light from the side on which the red laser diode 81, the green laser diode 82, and the blue laser diode 83 are installed from reaching the scanning unit 120.

The optical module 1 in the present embodiment includes the mirror mechanism 110 (the first support member 111, the second support member 112, the third support member 113, and the second mirror 114) disposed outside the protective member 2 (the cap 40 and the base 10) and integrated with the protective member 2. Therefore, components used to form the optical paths from the light emitting unit 3 to the scanning unit 120 can be easily disposed close to each other. This allows the light from the light emitting unit 3 to reach the scanning unit 120 easily while an increase in the size of the optical module 1 is prevented. As described above, the optical module 1 in embodiment 1 has excellent durability while an increase in size is prevented.

In the optical module 1 in the present embodiment, the light from the scanning unit 120 is emitted to the outside of the protective member 2 through the second window 42. As described above, the second window 42 on which the light traveling from the mirror mechanism 110 to the scanning unit 120 is incident is used as the path for light emitted from the scanning unit 120, and this allows the number of components to be reduced.

Embodiment 2

Figure 7:
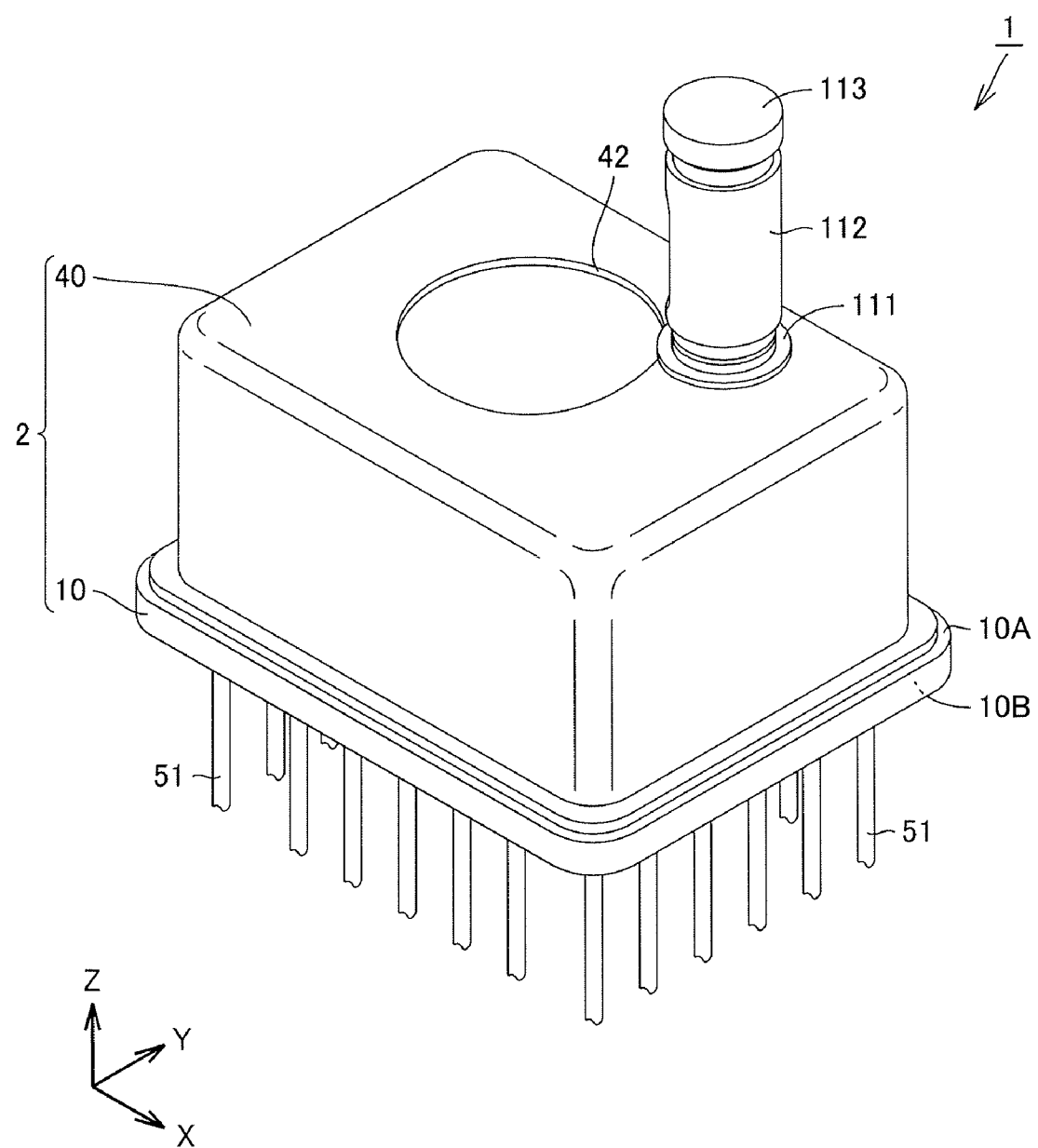
FIG. 7 is a first schematic perspective view showing the structure of an optical module in embodiment 2.
Figure 8:
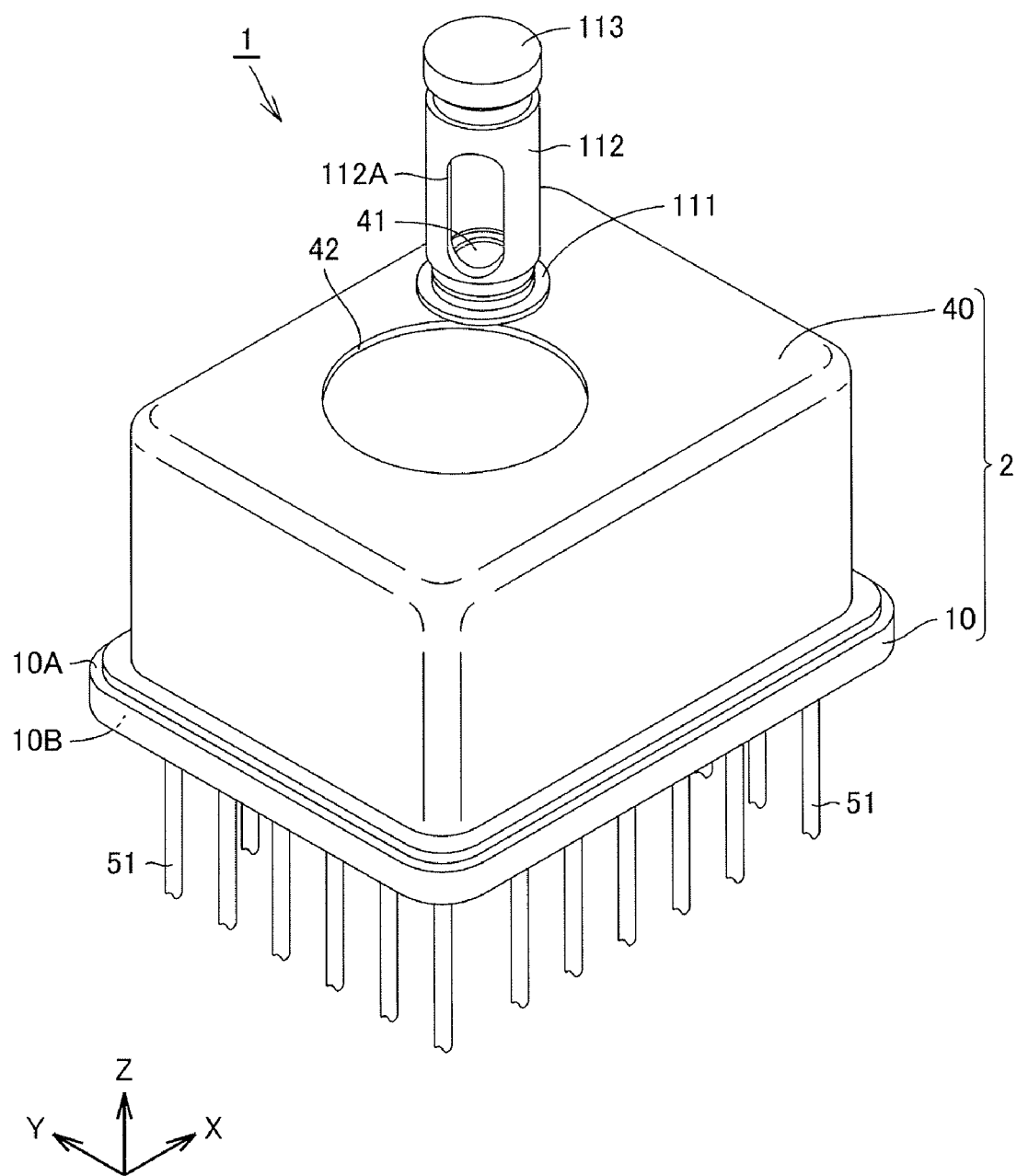
FIG. 8 is a second schematic perspective view showing the structure of the optical module in embodiment 2.
Figure 9:
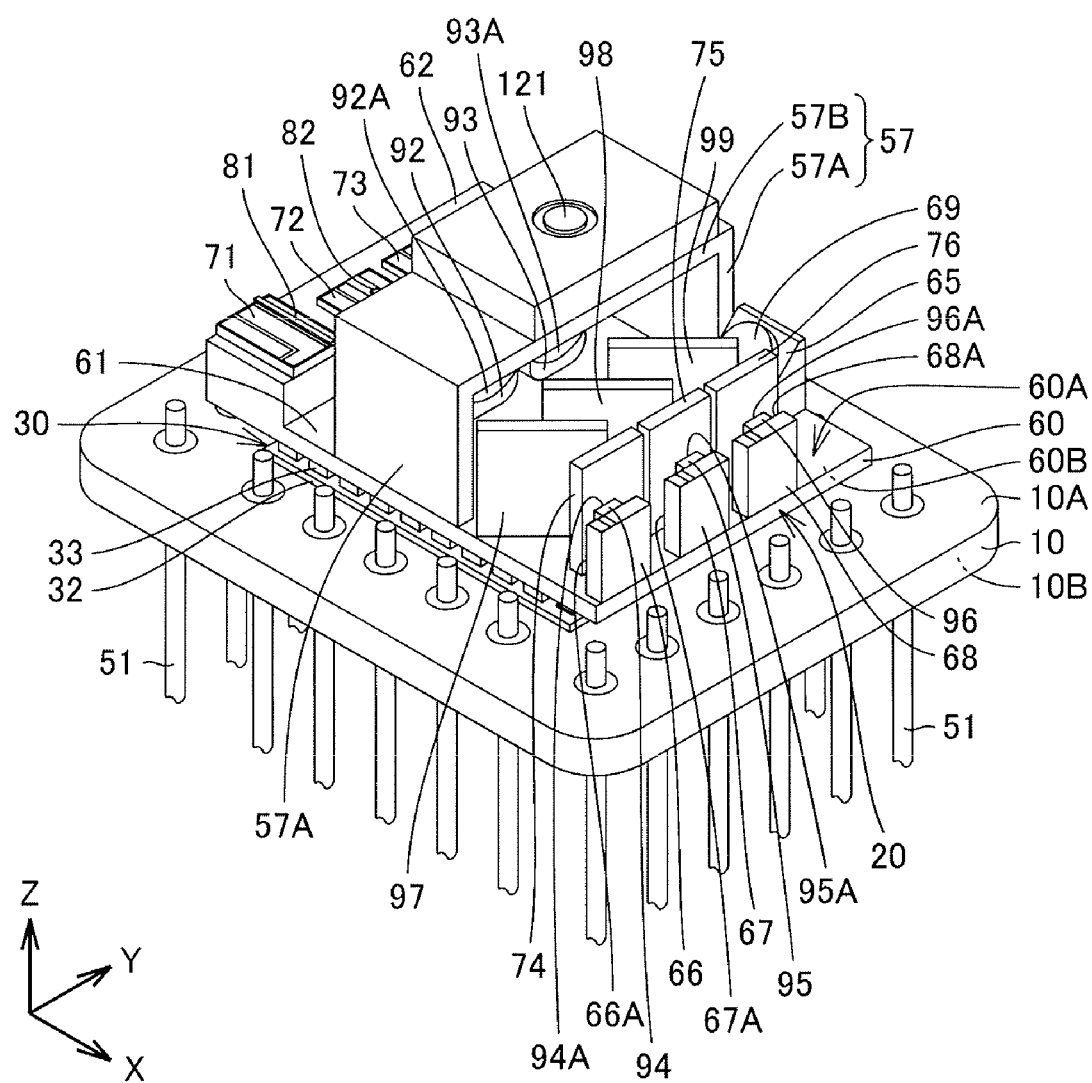
FIG. 9 is a schematic perspective view with a cap in FIG. 7 removed.
Figure 10:
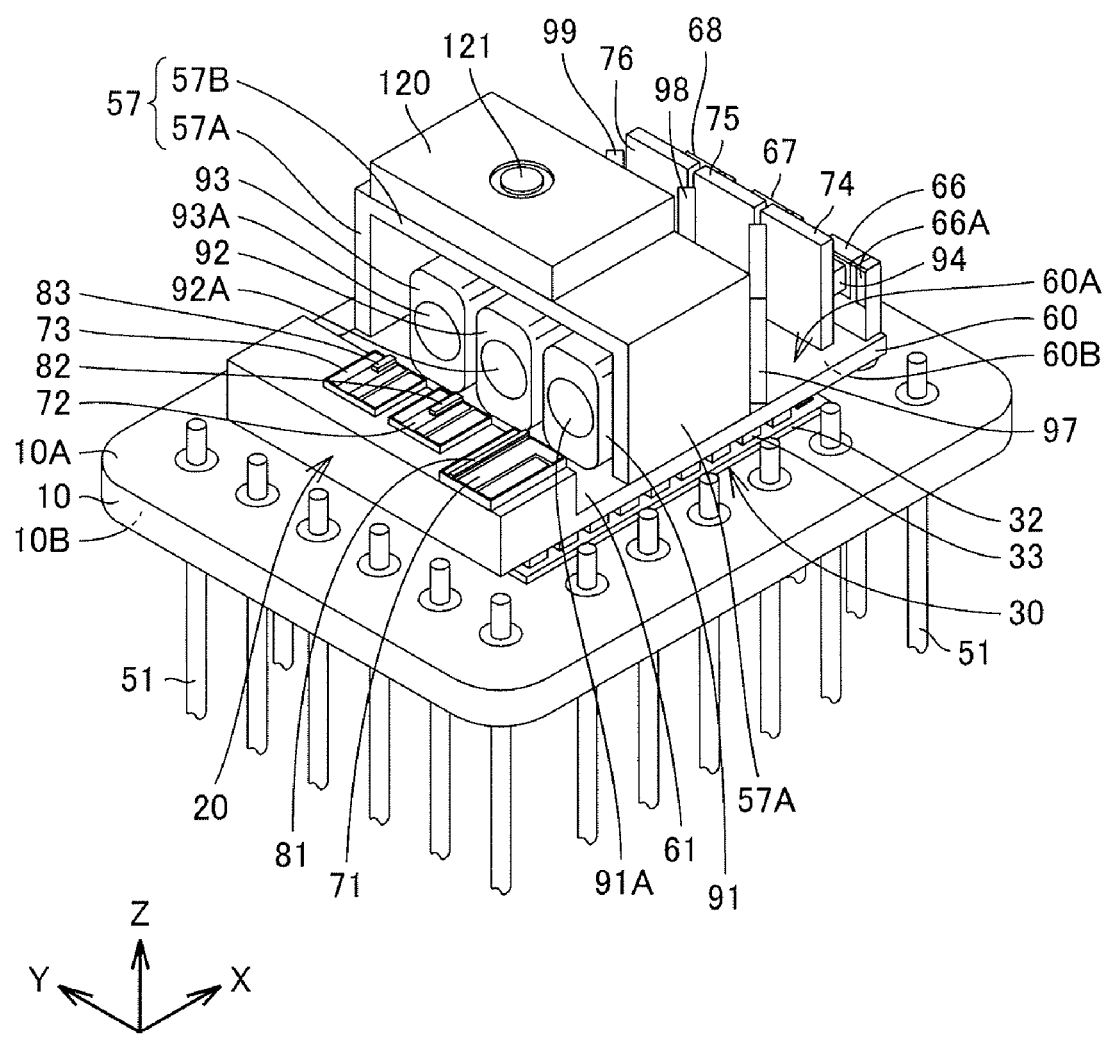
FIG. 10 is a schematic perspective view with the cap in FIG. 8 removed.
Figure 11:
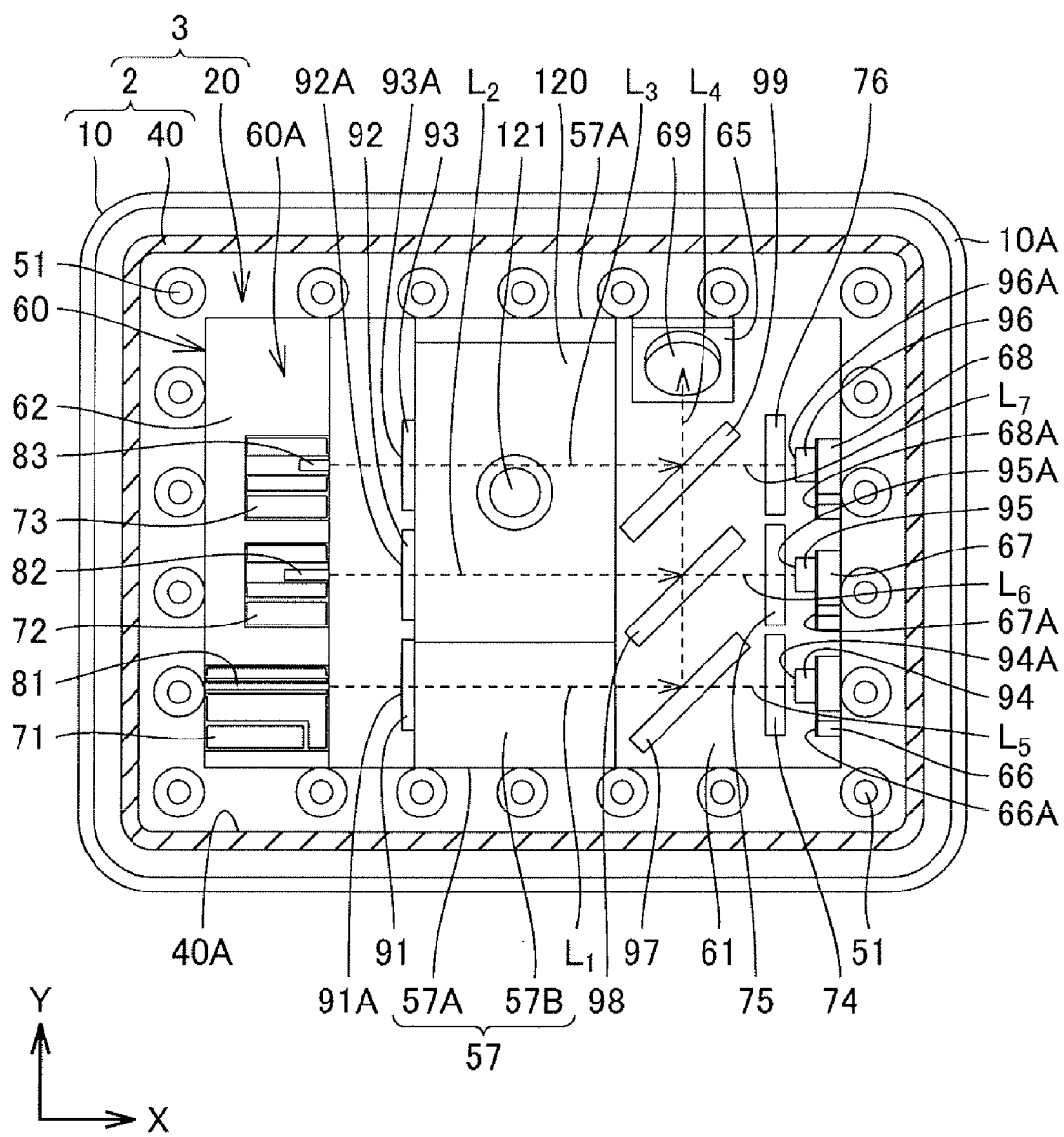
FIG. 11 is a first schematic illustration showing the structure of the optical module in embodiment 2.
Figure 12:
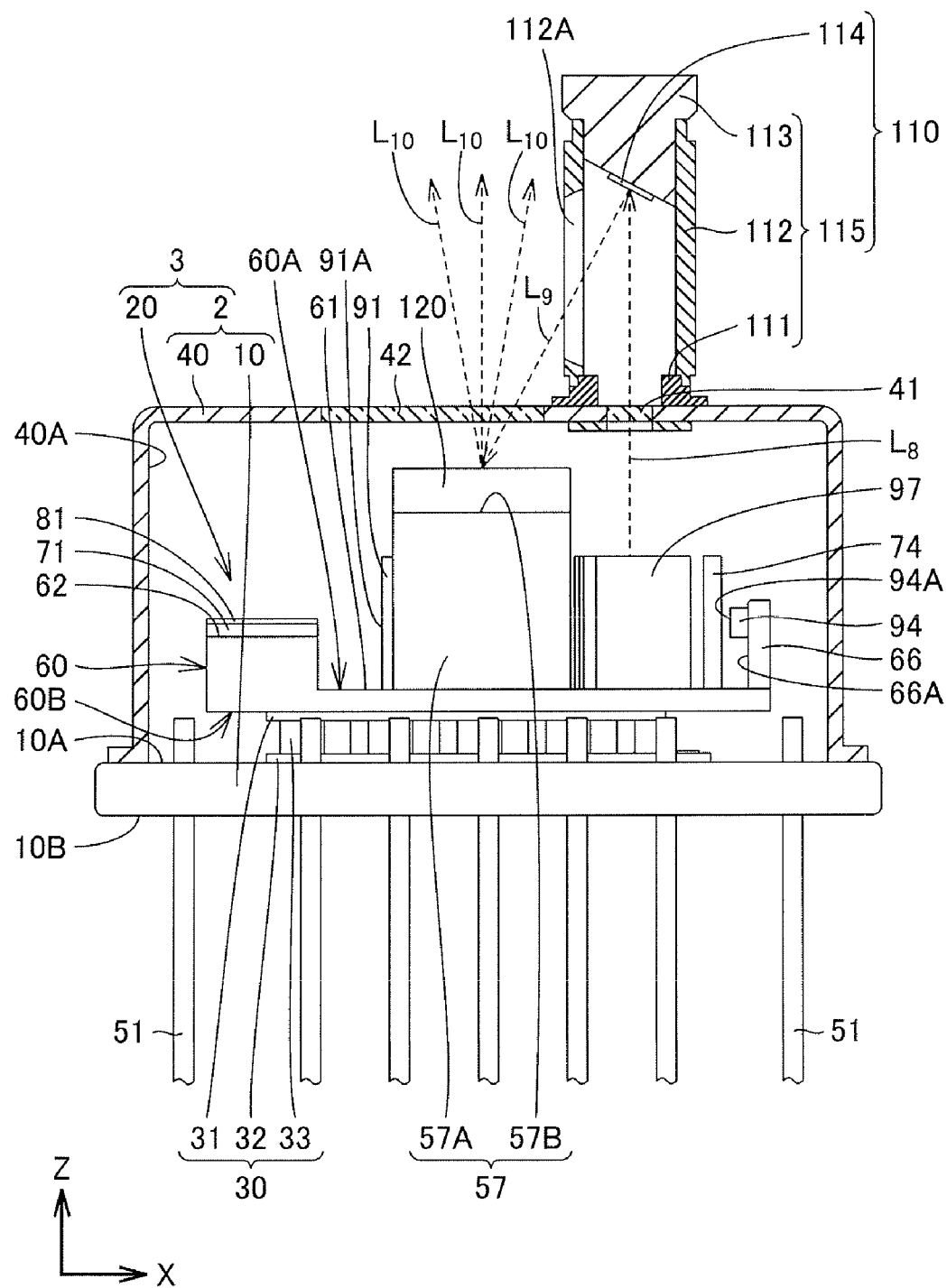
FIG. 12 is a second schematic illustration showing the structure of the optical module in embodiment 2.

Referring next of FIGS. 7 to 12, embodiment 2, which is another embodiment, will be described. FIG. 7 is a first schematic perspective view showing the structure of an optical module in embodiment 2. FIG. 8 is a second schematic perspective view showing the structure of the optical module in embodiment 2 when it is viewed from a different viewpoint from that in FIG. 7. FIG. 9 is a perspective view corresponding to a state with a cap 40 in FIG. 7 removed. FIG. 10 is a perspective view corresponding to the state with the cap 40 in FIG. 8 removed. FIG. 11 is a first schematic illustration in the X-Y plane showing a cross section of the cap 40 and a plan view of other components. FIG. 12 is a second schematic illustration in the X-Z plane showing cross sections of the cap 40 and a mirror holder 115 and a plan view of other components.

The optical module 1 in the present embodiment has basically the same structure as that of embodiment 1 and has the same effects. However, the optical module 1 in embodiment 2 differs from that in embodiment 1 in the arrangement of the scanning unit 120 and the shape of the base plate 60.

Referring to FIGS. 7 to 12 and FIGS. 1 to 6, in the base plate 60 in embodiment 2, the formation of the lens mounting region 63 and the filter mounting region 64 is omitted, and the region other than the chip mounting region 62 serves as the base region 61. In embodiment 2, the first light shield member 59 and the second light shield member 58 are also omitted. Other members disposed on the first principal surface 60A of the base plate 60 in embodiment 1 are disposed similarly in plan view as viewed in the direction perpendicular to the first principal surface 60A. The first mirror mounting region 65 is formed at the same position as in embodiment 1 in plan view as viewed in the direction perpendicular to the first principal surface 60A. The first mirror 69 is disposed in the first mirror mounting region 65.

The optical module 1 in embodiment 2 includes a scanning unit holding member 57 that holds the scanning unit 120 at a level different from the level of the chip mounting region 62 with respect to a direction perpendicular to the chip mounting region 62 that serves as a mounting surface of the base plate 60. More specifically, the scanning unit holding member 57 holds the scanning unit 120 in a region higher than the chip mounting region 62. The scanning unit holding member 57 is disposed in the base region 61 so as to straddle a region in which the first lens 91, the second lens 92, and the third lens 93 are present. The scanning unit holding member 57 includes a flat plate-shaped holding portion 57B and a pair of leg portions 57A that support the holding portion 57B on the base region 61. The scanning unit holding member 57 is disposed such that a pair of principal surfaces of the holding portion 57B are arranged along the base region 61, more specifically such that the pair of principal surfaces of the holding portion 57B are parallel to the base region 61. The scanning unit 120 is placed on one of the principal surfaces of the holding portion 57B (on the principal surface opposite to the side facing the base region 61). By separating the level at which the semiconductor light emitting elements, the lenses, the filters, etc. are disposed on the base plate 60 from the level at which the scanning unit 120 is disposed, stray light from the region in which the semiconductor light emitting elements are disposed can be effectively prevented from reaching the scanning unit 120.

In the structure described in embodiment 2, the first light shield member 59 and the second light shield member 58 are omitted. However, the first light shield member 59 and the second light shield member 58 may be disposed in the structure of embodiment 2 in the same manner as in embodiment 1.

In the description of the above embodiments, the light beams from the three semiconductor light emitting element are multiplexed. However, the number of semiconductor light emitting elements may be two or four or more. In the description of the above embodiments, the semiconductor light emitting elements used are laser diodes. However, the semiconductor light emitting elements used may be, for example, light emitting diodes. In the examples shown in the above embodiments, the first filter 97, the second filter 98, and the third filter 99 used are wavelength selective filters. However, these filters may be, for example, polarization beam combining filters. In the description of the above embodiments, the semiconductor light emitting elements used are chip-shaped laser diodes. However, each semiconductor light emitting element used may have, for example, a structure in which the laser diode chip is sealed in a metallic case.

It should be understood that the embodiments disclosed herein are illustrative in all aspects and non-restrictive in every respect. The scope of the present invention is defined not by the above description but by the scope of the claims. It is intended that the present invention includes all modifications which fall within the scope and meanings equivalent to the scope of the claims.

REFERENCE SIGNS LIST 1 optical module, 2 protective member, 3 light emitting unit, 10 base, 10A, 10B principal surface, 20 light forming unit, 30 electronic cooling module, 31 heat absorption plate, 32 heat dissipation plate, 33 semiconductor pillar, 40 cap, 41 first window, 42 second window, 51 lead pin, 57 scanning unit holding member, 57A leg portion, 57B holding portion, 58 second light shield member, 58A fourth through hole, 58B fifth through hole, 58C sixth through hole, 59 first light shield member, 59A first through hole, 59B second through hole, 59C third through hole, 60 base plate, 60A, 60B principal surface, 61 base region, 62 chip mounting region, 63 lens mounting region, 64 filter mounting region, 65 first mirror mounting region, 66 first support plate, 66A, 67A, 68A surface, 67 second support plate, 68 third support plate, 69 first mirror, 71 first submount, 72 second submount, 73 third submount, 74 fourth filter, 75 fifth filter, 76 sixth filter, 81 red laser diode, 82 green laser diode, 83 blue laser diode, 91 first lens, 91A, 92A, 93A lens portion, 92 second lens, 93 third lens, 94 first photodiode, 94A light receiving portion, 95 second photodiode, 95A light receiving portion, 96 third photodiode, 96A light receiving portion, 97 first filter, 98 second filter, 99 third filter, 110 mirror mechanism, 111 first support member, 112 second support member, 112A through hole, 113 third support member, 114 second mirror, 115 mirror holder, 120 scanning unit, 121 scanning mirror

The invention claimed is:

1. An optical module comprising:
a light emitting unit configured to generate light;
a mirror mechanism configured to reflect the light generated by the light emitting unit; and
a scanning unit configured to scan the light reflected from the mirror mechanism,
wherein the light emitting unit includes: a light forming unit including a plurality of semiconductor light emitting elements and a filter configured to multiplex light beams from the plurality of semiconductor light emitting elements; and a protective member disposed so as to surround the light forming unit,
wherein the mirror mechanism is disposed outside the protective member and integrated with the protective member, and
wherein the scanning unit is disposed in a region surrounded by the protective member.

2. The optical module according to claim 1,
wherein the light forming unit includes a member having a plurality of through holes provided so as to correspond to the respective semiconductor light emitting elements, and each of the plurality of through holes is configured to allow only the light beam from a corresponding one of the plurality of semiconductor light emitting elements to pass through.

3. The optical module according to claim 1, further comprising a scanning unit holding member that holds the scanning unit at a level different from the level of a mounting surface of the light forming unit with respect to a direction perpendicular to the mounting surface, the mounting surface being a surface on which the plurality of semiconductor light emitting elements are mounted.

4. The optical module according to claim 1,
wherein the mirror mechanism includes:
a mirror configured to reflect the light generated by the light emitting unit; and
a mirror holder placed on the protective member and holding the mirror.

5. The optical module according to claim 1,
wherein the protective member has: a first window from which the light directed from the light emitting unit toward the mirror mechanism is emitted; and a second window through which the light reflected from the mirror mechanism and directed toward the scanning unit enters.

6. The optical module according to claim 5,
wherein the light scanned by the scanning unit is emitted to the outside of the protective member through the second window.

7. The optical module according to claim 1,
wherein the protective member is an airtight member whose interior is made airtight.

8. The optical module according to claim 1,
wherein the plurality of semiconductor light emitting elements include a first semiconductor light emitting element configured to emit red light, a second semiconductor light emitting element configured to emit green light, and a third semiconductor light emitting element configured to emit blue light.

9. The optical module according to claim 1,
wherein each of the plurality of semiconductor light emitting elements is a laser diode.

10. An optical module comprising:
a light emitting unit configured to generate light;
a mirror mechanism configured to reflect the light generated by the light emitting unit; and
a scanning unit configured to scan the light reflected from the mirror mechanism,
wherein the light emitting unit includes: a light forming unit including a plurality of laser diodes and a filter configured to multiplex light beams from the plurality of laser diodes; and a protective member disposed so as to surround the light forming unit,
wherein the mirror mechanism is disposed outside the protective member, integrated with the protective member, and includes a mirror configured to reflect the light generated by the light emitting unit and a mirror holder placed on the protective member and holding the mirror,
wherein the scanning unit is disposed in a region surrounded by the protective member,
wherein the protective member has: a first window from which the light directed from the light emitting unit toward the mirror mechanism is emitted; and a second window through which the light reflected from the mirror mechanism and directed toward the scanning unit enters, and
wherein the light scanned by the scanning unit is emitted to the outside of the protective member through the second window.

* * * * *